United States Patent [19]

Schwerin

[11] Patent Number: 4,619,841
[45] Date of Patent: Oct. 28, 1986

[54] SOLDER LEVELER

[76] Inventor: Thomas E. Schwerin, 2131 N. 1st St., Flagstaff, Ariz. 86001

[21] Appl. No.: 417,428

[22] Filed: Sep. 13, 1982

[51] Int. Cl.$^4$ ............................ B23K 1/08; B05D 5/12
[52] U.S. Cl. .......................................... 427/96; 118/56; 118/58; 228/20; 228/40; 427/273
[58] Field of Search ...................... 118/58, 56; 427/96; 228/20, 40, 19

[56] References Cited

U.S. PATENT DOCUMENTS

| 2,671,264 | 3/1954 | Pessel | 428/601 |
| 3,795,358 | 3/1974 | Sarnacki | 228/19 |
| 3,865,298 | 2/1975 | Allen | 228/20 |

Primary Examiner—John E. Kittle
Assistant Examiner—James J. Seidleck
Attorney, Agent, or Firm—Boniard I. Brown

[57] ABSTRACT

Printed circuit boards that may contain through-holes, conductors, connectors, etc. are soldered by covering such boards with liquid solder. During such a process, excess or undesirable solder is typically residual on the surface of such boards, and, more specifically, within the through-holes. By the present system, the printed circuit boards are placed in contact with liquid flux, then with liquid solder and are then removed from contact with the liquid solder and passed between two heat transfer medium spray elements which are fully immersed within the heat transfer medium. Said spray elements direct generally opposing laminar flows, enhanced by a Venturi effect, onto such board thereby sweeping off the undesired solder, clearing the holes, and leaving an optimum thickness solder layer where appropriate. The excess solder removed is collected within the system reservoir to be returned to the solder tank for reuse. A final rinse is provided to remove heat transfer medium from the printed circuit board.

17 Claims, 5 Drawing Figures

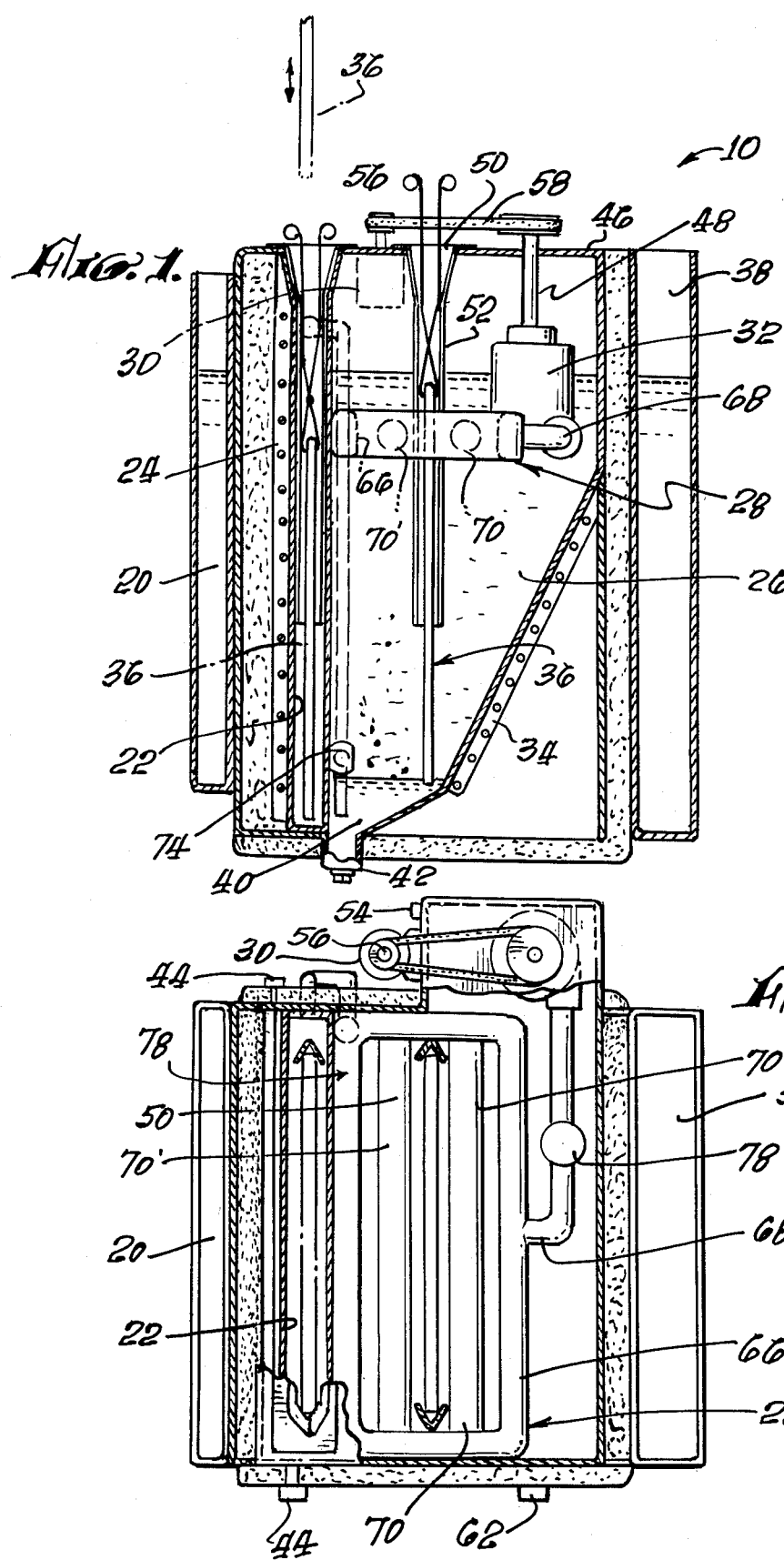

U.S. Patent   Oct. 28, 1986   Sheet 2 of 2   4,619,841
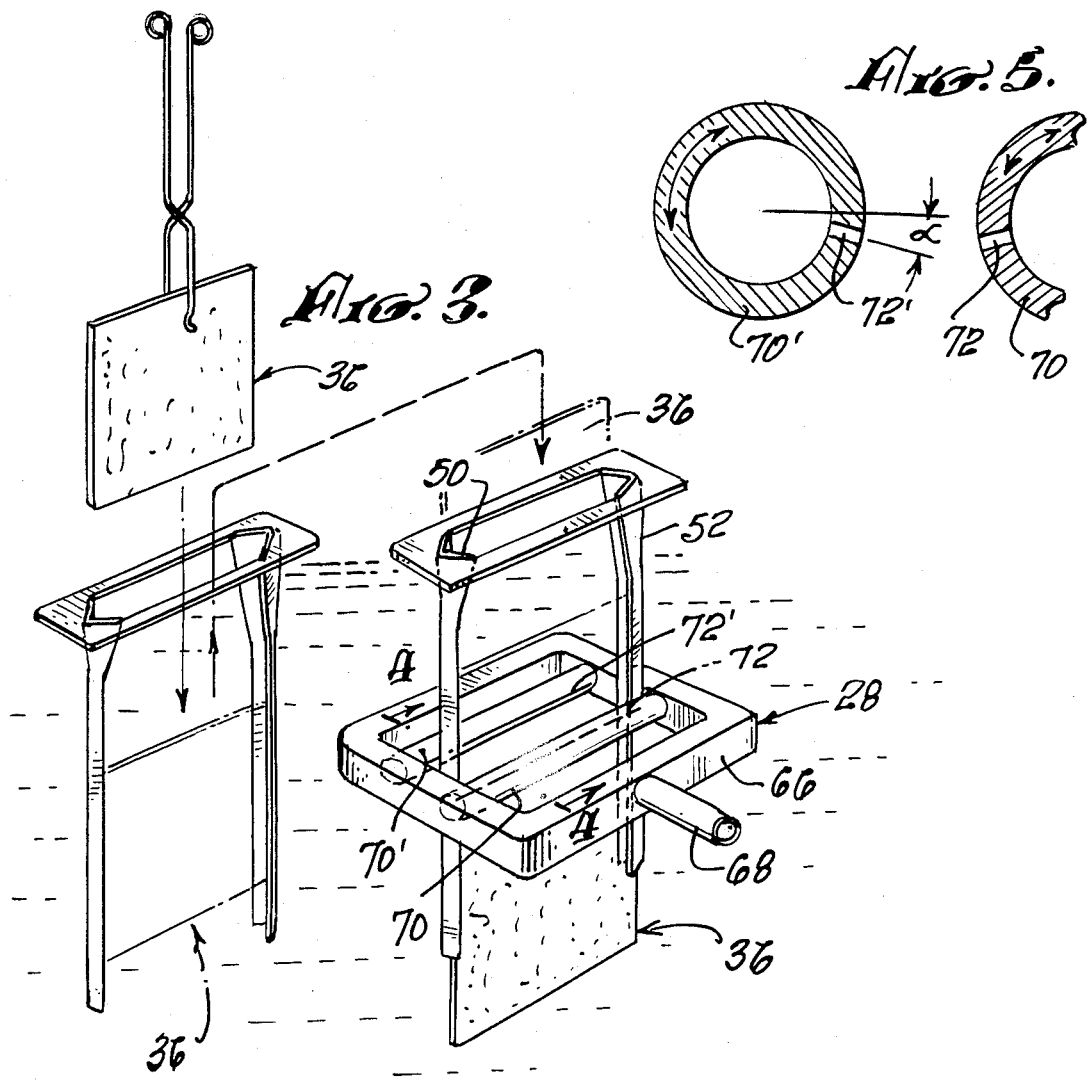
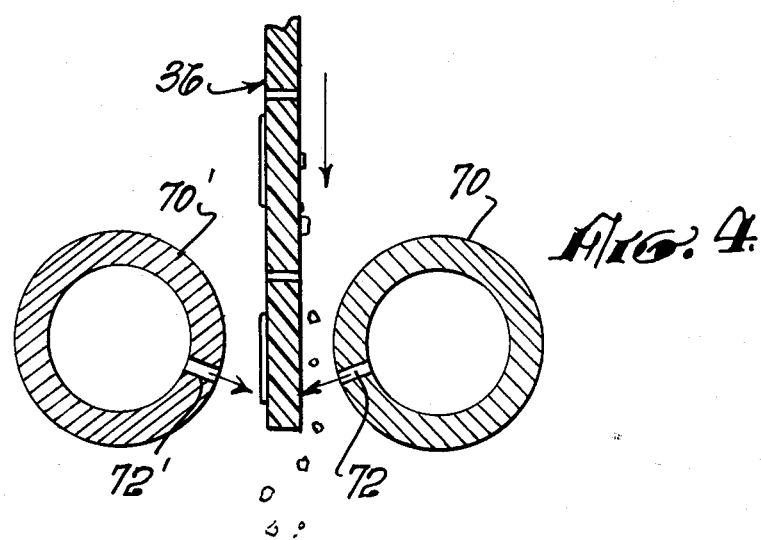

SOLDER LEVELER

BACKGROUND OF THE INVENTION

This invention relates to removing excess or undesirable solder from printed circuit boards, clearing it from through-holes in such boards, and generally providing a relatively uniform solder level where appropriate on such boards. (For convenience herein such a printed circuit board will be generally referred to as a PCB.)

Of these prior systems within the knowledge of the herein inventor, all such systems rely upon covering the PCB with flux and then dipping it into hot liquid solder. These processes generally leave an uneven or undesirably thick layer of solder on the PCB which plugs through-holes used to connect the two sides of the board. The through-holes are typically required to be clear of plugging so that the leads of various electronic components may be inserted therein.

Various methods of leveling the solder and removing the excess, including that located in the through-holes, have been previously described in the prior art. Such methods involved the spraying of hot solutions or hot gases onto the PCB. More specifically, those systems relying on hot gases sprayed in air typically produce non-uniform through-holes and tend to be sufficient in removal of short circuit paths. In those systems relying on hot solutions sprayed in air, the resulting solder thickness left on the PCB is often inadequate for industry standards.

Such difficulties arise from the inability of such systems to adequately control the direction, flow shape, and flow rates of the medium used therein. The herein invention presents a solution to such problems, as well as providing for improved environmental control.

SUMMARY OF INVENTION

In view of the disadvantages of the prior art relative to the improvements herein set forth, it is an object of this invention to provide for coating of PCB's with flux and solder, and to then provide for removal of excess solder, clearing of through-holes, and recovery of the excess solder without the use of repeated processing and repeated thermal shock.

It is the further object of this invention to provide variability within the apparatus for removal of excess solder from PCB's of differing thickness and through-holes of varying diameter, such that a set of similar PCB's may be processed on a repetitive basis with identical results.

Various other objects and advantages will become evident from the following description of this invention and the most novel features will be identified in connection with the appended claims.

It is understood that various changes in the details, arrangements, materials, and process steps which are herein described and illustrated to better explain the nature of the invention may be made by those skilled in the art without departing from the scope of this invention.

The herein invention comprises, in brief, an apparatus and process for coating PCB with a uniformly leveled solder thickness and cleared, smoothly coated through-holes to satisfy industry standards. Such apparatus and process consists of means for sequentially contacting the surfaces of a PCB with flux and liquid solder, and then removing the excess solder from the paths and through-holes by immersing it within a heat transfer medium bath wherein ribbon laminar flows of the heat transfer medium are directed against the coated surfaces of the PCB, such that both sides of the PCB are treated simultaneously. The excess solder thus removed is collected in a sump region within the heat transfer medium bath from whence it may be recovered for reuse. A rinse bath is provided for removing the residual heat transfer medium from the PCB.

BRIEF DESCRIPTION OF THE DRAWINGS

FIG. 1 illustrates a partial cross-sectional side view of the apparatus.

FIG. 2 presents a top view of the apparatus.

FIG. 3 shows an exploded perspective view of the solder tank and the heat transfer medium bath and ribbon flow portion of the apparatus.

FIG. 4 shows a partial cross-sectional view of the ribbon flow tubes and their orientation relative to a PCB.

FIG. 5 illustrates schematically the variability in the orientation of the ribbon flow tubes.

DETAILED DESCRIPTION OF THE INVENTION

Referring now to FIG. 1, the herein "Solder Leveler" system 10 is depicted in cross-sectional view. Said system is structurally integrated and is comprises of a flux tank 20, a solder tank 22, with a heater element 24 external thereto, a heat transfer medium bath 26, within which is situated a ribbon flow manifold assembly 28 and which bath is heated by a second heater element 34, a motor 30, powered by an external electrical source, which drives a pump 32, which in turn transports the heat transfer medium from the heat transfer medium bath 26 through tubing to the ribbon flow manifold assembly 28 from which it is directed, within the heat transfer medium bath 26 against a PCB 36 which is passed vertically through the ribbon flow manifoldd assembly 28 such that PCB 36 becomes totally immersed in the heat transfer medium bath 26, and a rinse bath tank 38, provided to cleanse the PCB of residual heat transfer medium.

The lowest region of the heat transfer medium bath 26 serves as a sump region 40 whereat the excess solder removed from the PCB 36 is collected by gravity. A drain 42 is provided to enable drawing off the collected liquid solder for reuse. Pump means 74 and tubing 76 return the collected liquid solder to the solder tank 22.

Referring now to FIG. 1 and FIG. 2, a more complete structural description is given for the "Solder Leveler" system 10. As illustrated at the left of each figure, a flux tank 20, is configured as an elongated rectangular cylinder, open at the upper end, such that its length, width, and depth are sufficient to receive any of the standard sizes of PCB's commonly used in PCB art. Within said flux tank 20 is contained sufficient liquid flux, which flux, when a PCB is inserted into said flux tank 20, said PCB becomes fully immersed in said flux which contacts the surfaces of the PCB to properly prepare the surfaces to accept solder.

Contiguously affixed to the flux tank 20 by the exterior structure of the system 10 is a liquid solder tank 22. Said tank 22 is also configured as an elongated rectangular cylinder, open at the upper end, such that its length, width, and depth are sufficient to receive any of the standard sizes of PCB's commonly used in PCB art. Within said solder tank 22 is contained sufficient solder, which solder, when a PCB is inserted into said solder tank 22, contacts the surfaces of the PCB to adhere to and fuse with the metallic surfaces prepared by the flux. Said solder is maintained in a liquid form within the solder tank 22 by heater elements 24 disposed external to said solder tank 22 along the length and depth dimensions of the solder tank wall in closest proximity to the flux tank 20. The said heater elements 24 are energized by an external electrical source and the temperature of the liquid solder may be varied by the use of solder temperature control 44 located on the external wall of the system 10.

The right wall of the solder tank 22, as viewed in FIGS. 1 and 2, forms one wall of the heat transfer medium bath 26. Said bath 26, when viewed from the side as in FIG. 1, has a cross-section approximating the union of two trapezoidal shapes having right angles at the upper corners. When viewed from the top as in FIG. 2, the upper cross-section is generally rectangular, with a smaller rectangle projecting from the upper side, as in FIG. 2. Said bath 26 is of sufficient width and length to house a ribbon flow manifold 28, with a pump 32 being situated in the smaller rectangle region. Said pump 32 is rigidly affixed to the exterior wall of the bath 26. Said ribbon flow manifold 28 will be discussed more fully hereinbelow.

The heat transfer medium bath 26 is covered by a top member 46. Said top member 46 is removably affixed to the walls to the said bath 26 to enable servicing of the interior. Said top member 46 provides a circular hole for the drive shaft 48 of the pump 32 to enable said shaft 48 to extend vertically through the top member 46. Said top member 46 also contains an elongated recetangular slot opening 50, having sufficient length and width to accept PCB's having dimensions commonly found in the PCB art.

Depending from and rigidly affixed to the said top member 46 are a pair of guide elements 52, 52', which guide elements consist of rectangular planar segments extending parallel to the slot 50 and downwardly to the top of the ribbon flow manifold assembly 28 but not affixed thereto.

External to the small rectangular area of the heat transfer medium bath 26, and rigidly affixed to the wall thereof, is a pump drive motor 30. Said motor 30 is energized by an external electrical power source and is controlled by an on-off switch 54 situated on exterior wall of the system 10. The shaft 56 of the motor 30 is coupled to the drive shaft 48 of the pump 32 by pulley and belt means 58.

The said pump 32 has its intake port situated below the fluid level of the heat transfer medium contained within the heat transfer medium bath 26. The output of said pump 32 is directed through a tube element 60 to the input of the ribbon flow manifold 28.

A second, separate heating element 34 is affixed to the exterior of the lower portion of the heat transfer medium bath 26. Said heating element 34 is controlled by control means 62 affixed to the exterior of the system 10.

Depending from and affixed to the rightmost wall of the heat transfer medium bath 26 is a rinse tank 38 having the general shape of an elongated rectangular cylinder, open at the upper end. The length, width and depth of said rinse tank 38 are such that PCB's having dimensions commonly used in the PCB art may be fully immersed therein.

The entire system 10 is encased within an insulated structure 64 for safety and which structure 64 provides a supporting stand.

Referring now to FIG. 3, the ribbon flow manifold assembly 28 is comprised of a manifold tube element 66, having a generally rectangular, closed loop configuration, with a generally rectangular cross-section. The corners of the rectangle are rounded for convenience. Depending outwardly with respect to the rectangle, from the side wall of the manifold tube element 66 is an inlet tube element 68, which couples to the pump output tube 60 of IFG. 2. Spanning the longer dimension of the rectangle formed by the manifold tube element 66 are two parallel, ribbon tube elements 70, 70'. Said ribbon tube elements 70, 70' are coupled to the manifold tube element 66 at each end such that they are capable of rotation about their respective longitudinal axes, while providing an essentially fluid tight coupling. The said ribbon tube elements 70, 70' are separated, at the closest proximity of their respective outer walls, by a distance sufficient to allow the respective ribbon flows to proceed through the ambient heat transfer medium within the bath 26, forming laminar flows enhanced by a Venturi effect which impinge on the two sides of a PCB passing between said ribbon tubes 70, 70'. The creation of the laminar flows will be more fully described below. Valve means 78 are situated intermediate between the output tube 60 and the inlet tube element 68, which valve means 78 are externally controllable to vary the pressure of the heat transfer medium supplied to the ribbon flow manifold assembly 28.

Referring now to FIG. 4, wherein are shown cross sections of the ribbon tube elements 70, 70' and their relationship to a partial cross section of a PCB 36, a volume of heat transfer medium, under pressure produced by the pump means, is allowed to escape from the said ribbon tube elements 70, 70' through ribbon slots 72, 72' formed longitudinally in the walls of the ribbon tube elements 70, 70'. Each ribbon tube element 70 has one such ribbon slot 72 extending the length of said ribbon tube element 70. Said ribbon slot 72 has length sufficient to span the width of standard PCB sizes that are found in the PCB art. It is to be noted that the wall thickness of the ribbon tube element 70, 70' is large compared with the width of the ribbon slots 72, 72', thereby providing a more parallel and uniform, directionally controllable, flow. The flow from the ribbon slots 72, 72' tends, through a Venturi effect, to draw medium from the region immediately surrounding the ribbon tubes 70, 70' and to cause such medium to be carried along with the flows. The static pressure of the ambient medium tends to compress the flows into a planar form of thickness equivalent to the width of slots 72, 72'.

Referring now to FIG. 5, the directions of the laminar flows emitting from the ribbon slots 72, 72' in the ribbon tubes 70, 70' may be angularly varied through an angle $\alpha$, where $\alpha$ is typically between 5 and 45 degrees.

Referring now to all of the figures as appropriate, the operation of the system 10 will be further described.

Prior to initiating operation of the system 10, the flux tank 20 is to be filled with liquid flux to a depth sufficient to enable a PCB to be fully immersed in the flux; sufficient solder is to be placed with the solder tank 22 such that when the solder tank heater element 24 is energized and the solder heater control 44 is varied to melt and maintain the solder in a heated liquid state, the depth of the solder will accept full immersion of a PCB;

sufficient heat transfer medium is to be placed within the heat transfer medium bath 26 to immerse the ribbon flow manifold assembly 28 to a depth of approximately three inches, which bath 26 also provides sufficient depth to enable full immersion of a PCB totally below the submerged level of the manifold assembly 28; and an appropriate solvent is to be placed within the rinse bath tank 38 to allow a PCB to be fully immersed therein.

Having accomplished these preparatory steps, the second heater element 34 is also energized and regulated by is control 62 to establish and maintain a temperature within the heat transfer medium that is above the melting point of the solder used. The solder heat control 44 is thereafter readjusted to maintain the liquid solder at a temperature approximately 25 degrees Fahrenheit above the temperature of the heat transfer medium.

When the temperatures have stabilized, the pump 32 is energized and, by regulation of the valve means 78, the pressure within the inlet tube element 68, the manifold tube element 66 and the ribbon tube elements 70, 70' is established at the desired level. The heat transfer medium emanating from the ribbon slots 72, 72' in the ribbon tube elements 70, 70' of the ribbon flow manifold assembly 28, when the system 10 is operating under the most effective temperatures and pressures, produces a forceful laminar flow within the ambient heat transfer medium which action is enhanced through the Venturi effect within the ambient heat transfer medium to increase the volume of heat transfer medium impinging upon the sides of the PCB. Since the ribbon tube elements 70, 70' are capable of being rotated, with respect to the manifold tube element 66 about their respective longitudinal axes, through angles, as indicated in FIG. 5, the said laminar flow may be directed slightly downward. The preferred orientation is between 5 and 45 degrees of angle.

Following a typical PCB through the system 10, such a PCB 36 is first grasped by a transporting means, not part of the herein invention, which means will remain affixed to such a PCB throughout the process. Using such transporting means, such a PCB 36 is fully immersed into the flux tank 20, such that the PCB is properly exposed to and contacted by, the liquid flux. The fluxed PCB is removed from the flux tank 20 and next transported to and fully immersed within the liquid solder in the solder tank 22, which plates and solders those areas of the PCB prepared by the flux. The resulting soldered PCB will in general contain excess amounts of solder and plated through-holes may be plugged by solder. Additionally, short circuit paths may be formed between desired conductive paths by such excess solder.

The soldered PCB is then removed from the solder tank 22 and transported to the heat transfer medium bath 26 whereat it is inserted through the slot 50 in the top member 46, passing the guide elements 52, 52' and between the ribbon tube elements 70, 70' and their associated Venturi effect enhanced laminar flows from the ribbon slots 72, 72'. As the PCB is lowered, said laminar flows impinge upon the PCB, heating the solder thereon, with the surface layers of the solder being liquified and stripped away from PCB. The force of the laminar flows is such that through-holes in the PCB are cleared, and short circuit paths are broken since the solder will tend not to adhere in such places. Both sides of the PCB are simultaneously treated.

After fully immersing the PCB between the laminar flows from the ribbon slots 72, 72', the PCB is drawn upward, allowing the Venturi effect enhanced laminar flows to act a second time upon the PCB. The excess solder removed from the PCB, again liquified by the temperature of the heat transfer medium, falls by gravity through the heat transfer medium to the sump region 40, from whence it may be withdrawn by pump maans 74, through tubes 76 to the solder tank 22 for reuse.

When the PCB is fully withdrawn from the heat transfer medium bath 26, it is transported to the rinse bath tank 38 where it is fully immersed in the rinsing solvent therein to remove the residual heat transfer medium. Upon removal of the PCB from the rinse bath tank 38, the transporting means may be removed and the PCB delivered to the next stage of the total manufacturing process.

By appropriately varying the temperatures within the solder tank 22 and the heat transfer medium bath 26, the pressure within the ribbon flow manifold assembly 28, the angle of orientation of the ribbon slots 72, 72' of the ribbon tube elements 70, 70', and the time the PCB is exposed to each of the flux, solder, and laminar flow stages, the thickness of the residual solder on the resulting PCB can be repeatedly varied to meet requirements depending upon the application for which the PCB is fabricated.

While the above described invention has relied for discussion purposes upon specified preferred embodiments, those skilled in the art will find numerous variations of form that will accomplish the desired result. Each such variant is considered by the herein inventor to be within the scope of his invention as claimed. Further, those skilled in the art may readily recognize that this system may be automated for quantity production.

I claim:

1. Apparatus for removing excess solder from a printed circuit board containing conductive paths and plated through-holes and the like, comprising:

a container for retaining liquid flux,
   a container for retaining heated liquid solder,
   a container for retaining a heat transfer medium,
   a ribbon flow manifold assembly immersed in the heat transfer medium to produce forcefully directed, Venturi effect-enhanced laminar flows through said medium to simultaneously impinge upon each side of a soldered printed circuit board, thereby stripping excess solder from the conductive paths and plated through-holes of said printed circuit board, and wherein the ribbon flow manifold assembly contains two parallel ribbon tube elements separated at their respective closest proximity by a distance commensurate with the development of Venturi effect enhanced, laminar flows through the heat transfer medium, each ribbon tube element having a continuous longitudinal slot of width that is small with respect to the wall thickness of each of said ribbon tube elements and of length sufficient to span the width of the printed circuit board, said slots being oriented in rotation about the longitudinal axes of said ribbon tube elements such that flow through said slots are adjustably directed downwardly at an angle of between 5 and 45 degrees from direct opposition with each other, and
   pump means to drive said medium into said manifold assembly.

2. The apparatus of claim 1, further including controllable heating elements for separately heating the said solder container and said heat transfer medium container.

3. The apparatus of claim 1, further including valve means for varying the heat transfer medium pump output pressure.

4. The apparatus of claim 1, wherein the lower region of the container for retaining a heat transfer medium is configured as a sump to collect the excess solder removed from a printed circuit board, said sump region having drain means and pump means for removal, return, and reuse of such liquid solder collected therein.

5. The apparatus of claim 2, further including valve means for varying the pump output pressure.

6. The apparatus of claim 2, wherein the lower region of the container for retaining a heat transfer medium is configured as a sump to collect the excess solder removed from a printed circuit board, said sump region having drain means and pump means for removal, return, and reuse of such solder collected therein.

7. The apparatus of claim 2, further including a housing generally enclosing said containers, providing insulation and having appropriate openings in the top thereof to enable a printed circuit board to be inserted and immersed into each of said containers.

8. The apparatus of claim 3, wherein the lower region of the container for retaining a heat transfer medium is configured as a sump to collect the excess solder removed from a printed circuit board, said sump region having drain means and pump means for removal, return, and reuse of such solder collected therein.

9. The apparatus of claim 3, wherein the lower region of the container for retaining a heat transfer medium is configured as a sump to collect the excess solder removed from a printed circuit board, said sump region having drain means and pump means for removal, return, and reuse of such solder collected therein.

10. The apparatus of claim 5, wherein the lower region of the container for retaining a heat transfer medium is configured as a sump to collect the excess solder removed from a printed circuit board, said sump region having drain means and pump means for removal, return, and reuse of such solder collected therein.

11. The apparatus of claim 5, further including a housing generally enclosing said containers, providing insulation and having appropriate openings in the top thereof to enable a printed circuit board to be inserted and immersed into each of said containers.

12. The apparatus of claim 6, further including a housing generally enclosing said containers, providing insulation and and having appropriate openings in the top thereof to enable a printed circuit board to be inserted and immersed into each of said containers.

13. The apparatus of claim 10, further including a housing generally enclosing said containers, providing insulation and having appropriate opening in the top thereof to enable a printed circuit board to be inserted and immersed into each of said containers.

14. Apparatus according to claim 1, and further including a container for retaining a solvent to remove residual heat transfer medium from the printed circuit board.

15. Apparatus according to claim 4, and further including a container for retaining a solvent to remove residual heat transfer medium from the printed circuit board.

16. A process for treating printed circuit boards and the like to solder and then to remove excess solder from such boards and plated through-holes therein comprising:
   suspending a flat sided substrate, having a pattern of conductive paths thereon and plated through-holes therein, and sequentially immersing such substrate into a flux solution,
   thence into a liquid solder, and
   thence into a heat transfer medium bath wherein is implemented a uniform and controlled Venturi effect-enchanced laminar flow of heat transfer medium within the volume of said heat transfer medium, such flow being adjustably angled downwardly from direct normal impingement upon the sides of the substrate as said substrate is immersed and removed from the heat transfer medium bath and such flow being longitudinally continuous across the width of the substrate.

17. A process according to claim 16, and further including the step of thence immersing the substrate in a solvent rinse bath wherein residual heat transfer medium is removed from the substrate.

* * * * *